United States Patent
Kunitama et al.

(10) Patent No.: US 12,316,285 B2
(45) Date of Patent: May 27, 2025

(54) SWITCHING MODULE

(71) Applicant: KYOSAN ELECTRIC MFG. CO., LTD., Yokohama (JP)

(72) Inventors: Hiroshi Kunitama, Yokohama (JP); Takuya Yoshida, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 109 days.

(21) Appl. No.: 17/769,072

(22) PCT Filed: Oct. 30, 2019

(86) PCT No.: PCT/JP2019/042558
§ 371 (c)(1),
(2) Date: Apr. 14, 2022

(87) PCT Pub. No.: WO2021/075064
PCT Pub. Date: Apr. 22, 2021

(65) Prior Publication Data
US 2024/0113667 A1  Apr. 4, 2024

(30) Foreign Application Priority Data
Oct. 15, 2019 (JP) .................... 2019-188936

(51) Int. Cl.
*H03F 3/217* (2006.01)
*H01L 23/66* (2006.01)

(52) U.S. Cl.
CPC .......... *H03F 3/2171* (2013.01); *H01L 23/66* (2013.01); *H01L 2223/6611* (2013.01); *H01L 2223/6672* (2013.01)

(58) Field of Classification Search
CPC ................. H03F 3/2171; H01L 23/66; H01L 2223/6611; H01L 2223/6672; H01L 24/49;
(Continued)

(56) References Cited

U.S. PATENT DOCUMENTS 5,079,497 A    1/1992  Barbu et al.
9,397,658 B2*  7/2016  Sicard ............... H02P 27/06
(Continued)

FOREIGN PATENT DOCUMENTS

EP    1470588 B1    9/2006
JP    2006-25567 A   1/2006
(Continued)

OTHER PUBLICATIONS

Office Action dated May 30, 2024, issued in counterpart KR Application No. 10-2022-7008370, with English translation. (10 pages).
(Continued)

*Primary Examiner* — Khanh V Nguyen
(74) *Attorney, Agent, or Firm* — WHDA, LLP

(57) ABSTRACT

The switching module has, mounted on a substrate thereof, a MOSFET and a driver circuit for applying drive voltage to a gate electrode of the MOSFET. In the switching module according to the present invention, the driver circuit is electrically connected to the MOSFET via a damping adjustment element and a bonding wire between the gate electrode and the driver circuit.

3 Claims, 3 Drawing Sheets

(58) Field of Classification Search
CPC . H01L 2224/48091; H01L 2224/48137; H01L 2224/48195; H01L 2224/48464; H01L 2924/19105; H01L 21/822; H01L 27/04; H03K 17/163; H03K 17/687; H03K 17/602; H03K 17/161; H02M 1/348; H02M 7/003; H02M 7/537; H02M 1/08
See application file for complete search history.

(56) References Cited

U.S. PATENT DOCUMENTS

| | | | |
|---|---|---|---|
| 9,473,086 B2* | 10/2016 | Laturell | H03F 3/2171 |
| 10,469,067 B2* | 11/2019 | Kaneda | H03K 17/08142 |
| 10,476,495 B2* | 11/2019 | Shimomura | H03K 17/687 |
| 10,498,212 B2* | 12/2019 | Chang | H03K 17/6872 |
| 10,651,846 B2* | 5/2020 | Fukushima | H03K 17/163 |
| 2006/0006432 A1 | 1/2006 | Shiraishi et al. | |
| 2008/0218264 A1 | 9/2008 | Kirchmeier et al. | |
| 2012/0013317 A1 | 1/2012 | Morino | |
| 2014/0184303 A1 | 7/2014 | Hasegawa et al. | |
| 2015/0381166 A1* | 12/2015 | Kittilä | H03K 17/162 327/109 |
| 2018/0183432 A1* | 6/2018 | Kondo | H02M 3/3155 |

FOREIGN PATENT DOCUMENTS

| | | |
|---|---|---|
| JP | 2008-228304 A | 9/2008 |
| JP | 5527070 B2 | 6/2014 |
| JP | 2017-92057 A | 5/2017 |
| JP | 2018-107494 A | 7/2018 |
| KR | 10-0154335 B1 | 12/1998 |
| KR | 10-2018-0073474 A | 7/2018 |

OTHER PUBLICATIONS

Decision to Grant Registration dated Jul. 29, 2024, issued in counterpart KR Application No. 10-2022-7008370, with English translation. (3 pages).
Office Action dated Mar. 28, 2024, issued in counterpart KR Application No. 10-2022-7008370, with English translation. (8 pages).
International Search Report dated Jan. 28, 2020, issued in counterpart International Application No. PCT/JP2019/042558. (2 pages).
Extended (Supplementary) European Seach Report dated Oct. 20, 2023, issued in counterpart EP Application No. 19949065.7.(9 pages).
Office Action dated Jan. 20, 2025, issued in counterpart CN Application No. 201980101404.0, with English translation. (15 pages).

* cited by examiner

SWITCHING MODULE

TECHNICAL FIELD

The present invention relates to a switching module applied to a Class D amplifier, in particular, relates to a switching module that includes a MOSFET applied to an amplifier of a high-frequency power supply and a driver circuit for applying a drive voltage to a gate electrode of the MOSFET.

BACKGROUND ART

A high-frequency power supply is applied as a power supply for ultrasonic oscillation, induction power generation, plasma generation or others, and has a function of converting a direct current into a high-frequency alternating current by a switching operation performed by a Class D amplifier. Such Class D amplifier performing the switching operation is characterized by high power efficiency and less heating value, and one using a metal-oxide-semiconductor field-effect transmitter (MOSFET) as a module for performing the switching operation is known.

As switching modules using such MOSFET, for example, Patent Literature 1 and Patent Literature 2 disclose switching modules, in which a MOSFET and a driver circuit for applying a gate drive voltage to a gate electrode of the MOSFET are mounted on a substrate. These switching modules are suitable for a high-frequency power supply and may further improve power supply conversion efficiency. These switching modules adopt a configuration to directly connect an output terminal of a driver and the gate electrode of the MOSFET by bonding wires.

CITATION LIST

Patent Literature

[Patent Literature 1] Japanese Patent Laid-Open Publication No. 2006-25567
[Patent Literature 2] Japanese Patent Laid-Open Publication No. 2008-228304

SUMMARY OF THE INVENTION

Problems to be Solved by the Invention

A switching operation with a MOSFET is performed by turning on and off the application of a gate drive voltage to a gate electrode. ON control brings the MOSFET into an ON state when a gate drive voltage applied from a driver circuit to the gate electrode of the MOSFET causes a gate-source voltage to exceed a predetermined value. On the other hand, OFF control stops the application of the gate drive voltage to make the gate-source voltage to be lower than the predetermined value, thereby bringing the MOSFET into an OFF state.

In the OFF control, a resonant circuit formed between the driver circuit and the MOSFET causes a resonance phenomenon, and consequently an amplitude of a resonance voltage is attenuated at a predetermined time constant while the resonance voltage vibrates due to internal components. A description will be made below by referring to the above-described voltage as a damping voltage.

In the OFF control, the gate-source voltage of the MOSFET vibrates due to a damping voltage. At this time, when the vibration of the damping voltage causes the gate-source voltage to exceed a threshold value for bringing the MOSFET into the ON state, the MOSFET goes into the ON state even if it receives an ON-command signal, thereby causing a problem of occurrence of a malfunction (erroneous ignition) that the MOSFET goes into the ON state when it should be in the OFF state.

Furthermore, the conventional switching module as shown in Patent Literature 1 or Patent Literature 2 employs the configuration to directly connect the output terminal of the driver and the gate electrode of the MOSFET with the bonding wires. In this configuration, between the driver circuit and the MOSFET, an RLC series-resonant circuit is formed due to a stray inductance and internal resistance of the bonding wires as well as a gate-source capacitance of the MOSFET. A damping rate (damping constant) of the damping voltage caused by series resonance of the RLC series-resonance circuit varies depending on the electrical characteristics of the bonding wires and the length of the wires.

However, in order to suppress the occurrence of the malfunction due to the damping voltage when the MOSFET equipped to the switching module is replaced, it is necessary to change the length of the bonding wires, the internal resistance in an internal output stage of a driver IC of the driver circuit and others, which requires a lot of time and effort. Moreover, when a chip of the MOSFET is replaced, a stray capacitance Ciss of the MOSFET in a band from several MHz to several tens MHz differs in a width of about 10 times. Hence, frequency resonance may cause an occurrence of an abnormal vibration phenomenon. Furthermore, if there is commonality of patterns of the driver circuit and the MOSFET equipped to the switching module, the length of the bonding wires is fixed, and consequently the length of the bonding wires and resistance components have fixed values.

The present invention aims to solve the above-described conventional problems, and an object of the invention is to provide a switching module that can suppress the occurrence of the malfunction due to the damping voltage in connection circuit of the MOSFET and the driver circuit even when the MOSFET is replaced or a used frequency is changed.

Means for Solving the Problem

To solve the above problems, one representative aspect of the invention is characterized by comprising a switching module, in which a MOSFET and a driver circuit for applying a gate drive voltage to a gate electrode of the MOSFET are mounted on a substrate, the driver circuit being electrically connected to the MOSFET through a damping adjustment element and bonding wires provided between the driver circuit and the gate electrode.

According to the present invention having the above-described configuration, the damping adjustment element that can adjust a damping rate (damping constant) of a damping voltage for a gate-source voltage is arranged between the driver circuit and the MOSFET, and the driver circuit and the MOSFET are electrically connected to each other via the damping adjustment element, so as to enable to suppress the occurrence of the malfunction due to the damping voltage which is generated by the change in the specification of the switching module, such as replacement of the MOSFET or change in the used frequency.

BEST MODE FOR CARRYING OUT THE INVENTION

A description about representative illustrative embodiments of a switching module of the present invention will now be described with reference to FIGS. 1 to 6.

Embodiment 1

Figure 1:
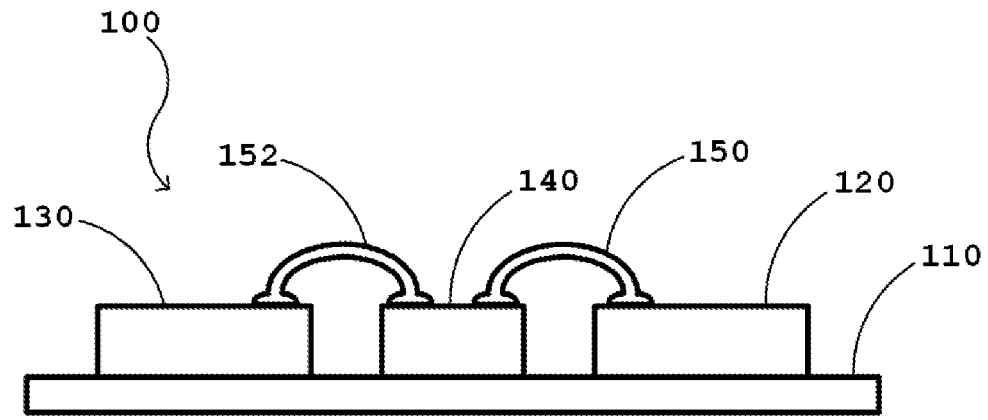
FIG. 1 is a side view schematically showing a switching module according to Embodiment 1, which is a representative example of the invention.

FIG. 1 is a side view schematically showing a switching module according to Embodiment 1 which is a representative example of the invention. The switching module presented in this specification can be applied to a high-frequency power supply or similar for semiconductor manufacturing equipment. In this case, an output of an illustrative amplifier is 1 kW or more and an output frequency is 0.3 MHz or more.

As shown in FIG. 1, a switching module 100 according to Embodiment 1 includes a substrate 110, a MOSFET 120 mounted on the substrate 110, a driver circuit 130 and a damping adjustment element 140, and bonding wires 150, 152 for electrically connecting these components. It is to be noted that FIG. 1 only shows a path to be connected to a gate electrode G of the MOSFET 120, and paths to be connected to a drain electrode D and a source electrode S for forming a part of an amplifier are not shown.

The substrate 110 is in the form of a flat-shaped member, by way of example, on which top face the MOSFET 120, the driver circuit 130 and the damping adjustment element 140 are mounted. The substrate 110 is made of a material having good heat conductivity, such as beryllium oxide (BeO) or aluminum nitride (AlN). Thus, heat generated during driving the module can be dissipated or exhausted effectively.

The MOSFET 120 is one of field effect transistors, which is configured, for instance, as a semiconductor device formed by laminating an oxide film as an insulation layer and a gate electrode G on a substrate made of silicon or similar, and further forming a drain electrode D and a source electrode S by ion implantation of high level of impurities. In the present invention, any MOSFET devices of common p-type or n-type can be employed.

The driver circuit 130 is configured to include a driving power supply and a switching system, both are not shown, so as to perform an ON and OFF operation of the switching system to apply a predetermined gate drive voltage to the gate electrode G of the MOSFET 120. As an example of the driver circuit 130, an IC chip having a push-pull circuit as an output stage, which is composed of a transistor and a MOSFET.

The damping adjustment element 140 is arranged between the MOSFET 120 and the driver circuit 130 on the substrate 110, and is electrically connected to the MOSFET 120 and the driver circuit 130 through the bonding wires 150 and 152, respectively. In Embodiment 1, the damping adjustment element 140 is configured as a gate resistance Rg, for example.

In such damping adjustment element 140, a resistance value of the gate resistance Rg is set in such a way that the resistance value is selected based on a stray capacitance of the MOSFET 120, as described below, so that a damping voltage (return voltage) Vgs1 of a gate-source voltage Vgs applied from the gate electrode G is set as a value that does not exceed a predetermined threshold value. That is to say, the resistance value of the gate resistance Rg of the damping adjustment element 140 is adjusted appropriately to thereby control a damping rate of the damping voltage (return voltage) Vgs1 with respect to an output voltage of the driver circuit 130.

As the bonding wires 150, 152, a wire made of gold, copper or aluminum is used, by way of example. In here, the bonding of the bonding wires 150, 152 to the respective components shown in FIG. 1 is implemented by a known manner, such as ball bonding or wedge bonding. Furthermore, the damping adjustment element 140 is attached changeably in accordance with the type of the MOSFET 120 and the output frequency used in the MOSFET 120.

Figure 2:
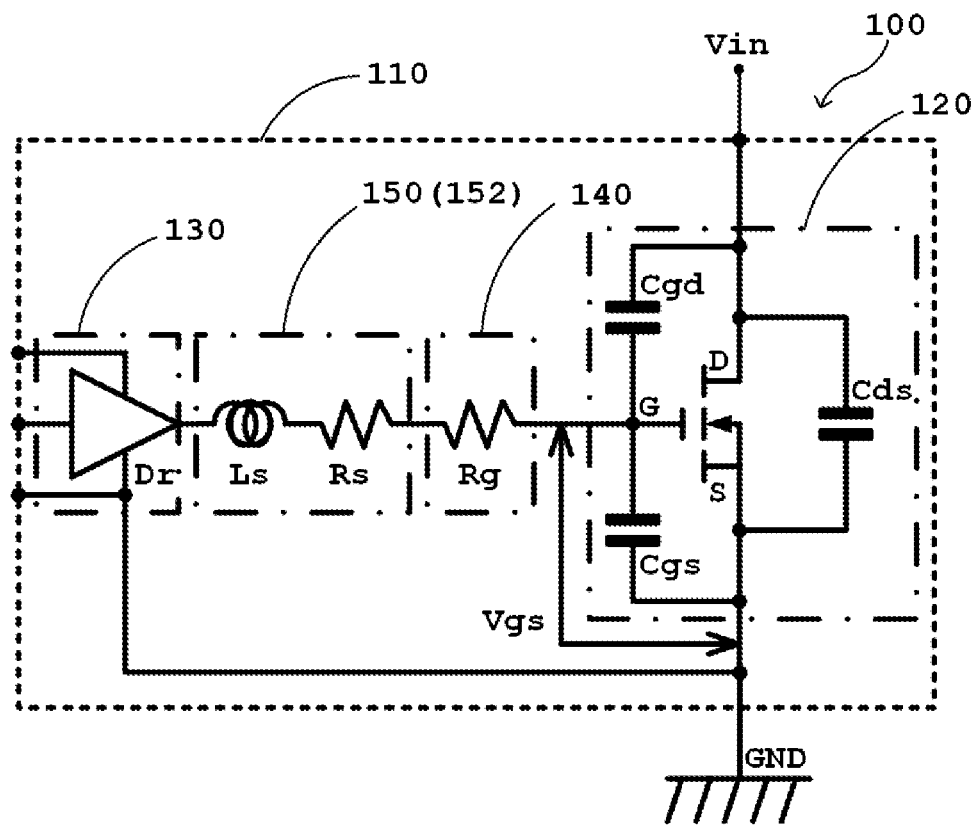
FIG. 2 is a circuit diagram showing equivalent connection circuit in the vicinity of the switching module of Embodiment 1 when the module is applied to an amplifier of a high-frequency power supply device.

FIG. 2 is a circuit diagram showing equivalent connection circuit in the vicinity of the switching module of Embodiment 1 when the switching module is applied to an amplifier of a high-frequency power supply device. FIG. 2 illustrates the case where a voltage input Vin and a ground GND are connected to the MOSFET 120, and different equivalent connection circuit of the high-frequency power supply device with different configurations will not illustrate or described in here.

As shown in FIG. 2, the MOSFET 120 and the driver circuit 130 are mounted on the substrate 110, between which the damping adjustment element 140 and the bonding wires 150, 152 are arranged and electrically connected to one another so as to form a connection circuit from the driver circuit 130 to the MOSFET 120. As described above, the damping adjustment element 140 shown in FIG. 1 is simulated as a gate resistance Rg, and the bonding wires 150, 152 are integrally simulated as a configuration that contains a stray inductance Ls and a resistance component Rs.

The driver circuit 130 includes a driver Dr that is connected to a ground GND as well as the binding wires 150, 152. Then, the gate-source voltage Vgs corresponding to the operation of the switching system described above is applied between the gate electrode G and the source electrode S of the MOSFET 120 by the output voltage from the driver circuit 130.

Figure 3:
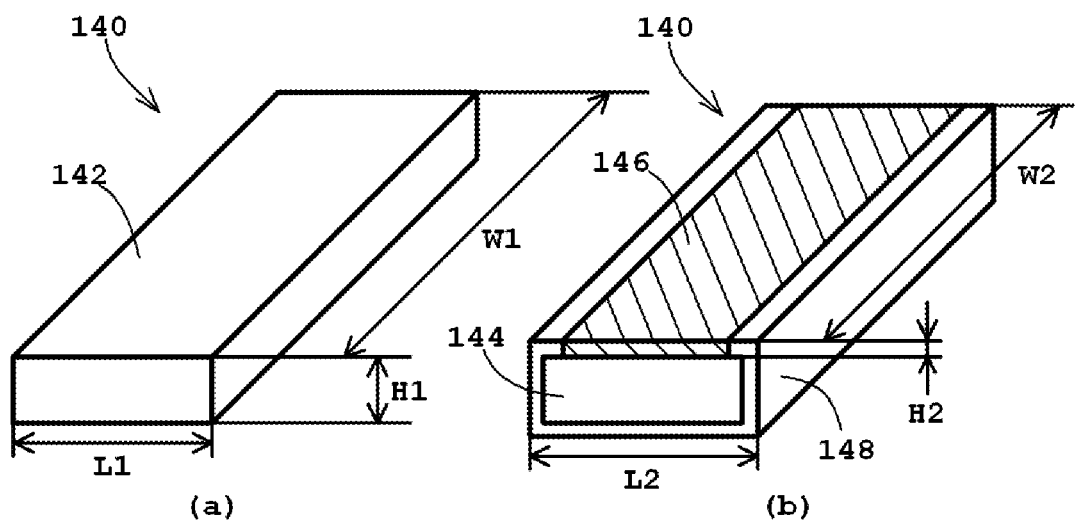
FIG. 3 is a perspective view showing a typical example and a variation of a damping adjustment element shown in FIG. 1.

FIG. 3 is a perspective view showing a typical example and a variation of the damping adjustment element shown in FIG. 1. As shown in FIG. 3(a), the damping adjustment element 140 is composed of a metallic member 142 with thickness H1, length L1 in a direction of element arrangement and width W1. By varying the thickness H1 and the width W1 of the metallic member 142 while fixing the length L1, distances between the components and lengths of the bonding wires 150, 152 can be kept constant to thereby adjust the gate resistance Rg of the damping adjustment element 140. And the metallic member 142 can be replaced with a commercially available electric resistor.

In addition to that, as a variation of the damping adjustment element 140 shown in FIG. 3(b), it is possible to apply a high-power chip resistor, a thin-film printed resistor and similar that is configured by laminating a resistive element 146 having thickness H2, length L2 in the direction of element arrangement and width W2 all over a base member 144, and then integrating them with a protection member 148. These configurations can also adjust the gate resistance Rg of the damping adjustment element 140 by varying the thickness H2 and the width W2 of the resistive element 146 while fixing the length L2 and thereby keeping the distances constant between the components and the lengths of the bonding wires 150, 152.

In the switching modules 100 with the configurations shown in FIGS. 1 and 2, the resistance value of the gate resistance Rg of the damping adjustment element 140 is determined according to the following procedure based on the stray capacitance of the MOSFET 120, by way of example.

As described above, the MOSFET 120 has the stray capacitance. Then, among the stray capacitances, an input capacitance Ciss is determined by the following Equation 1 by using a gate-source capacitance Cgs and a gate-drain capacitance Cgd.

$$Ciss = Cgs + Cgd \quad \quad 1$$

In addition to that, as described above, when the connection circuit is formed from the drive circuit 130 to the MOSFET 120 via the bonding wires 150, 152 and the damping adjustment element 140 in the equivalent circuit shown in FIG. 2, the stray inductances Ls of the bonding wires 150, 152, the resistance component Rs, the gate resistance Rg of the damping adjustment element 140 and the gate-source capacitance Cgs of the MOSFET 120 constitute a series-resonant circuit. It is known that when series resonance occurs in this series-resonant circuit, the gate-source voltage Vgs attenuates an amplitude based on a damping constant ζ expressed by the following Formula 2.

$$\zeta = \frac{Rs + Rg}{2}\sqrt{\frac{Ciss}{Ls}} \quad \quad 2$$

On the other hand, the MOSFET 120 goes into the ON state when a value of the applied gate-source voltage Vgs exceeds a predetermined value. However, the gate-source voltage Vgs does not switch instantly even when the switching control of the driver circuit 130 is turned off, resulting in generation of the so-called damping voltage (return voltage). In that case, a gate-source voltage Vgs1 after one cycle after the gate-source voltage Vgs from the driver circuit 130 is turned off can be calculated by the following Formula 3, where Vdr is an output voltage of the driver circuit 130.

$$Vgs1 = \frac{Vdr}{\sqrt{1-\zeta^2}} e^{\frac{-2\pi\zeta}{\sqrt{1-\zeta^2}}} \quad \quad 3$$

When the above-described Vgs1 exceeds a predetermined threshold value Vth which brings the MOSFET 120 into the ON state, the MOSFET 120 determines that an ON-command signal is input and goes into the ON state, thereby causing a malfunction (erroneous ignition) that the MOSFET goes into the ON state when it should be in the OFF state. In order to suppress such erroneous ignition of the MOSFET 120, the gate-source voltage Vgs1 after one cycle needs to be smaller than the above predetermined threshold value Vth (threshold voltage for bringing the MOSFET 120 into the ON state). That is to say, the resistance value of the gate resistance Rg is determined such that the Vgs1 expressed by Formula 3 becomes the damping constant ζ that is smaller than the threshold value Vth.

Figure 4:
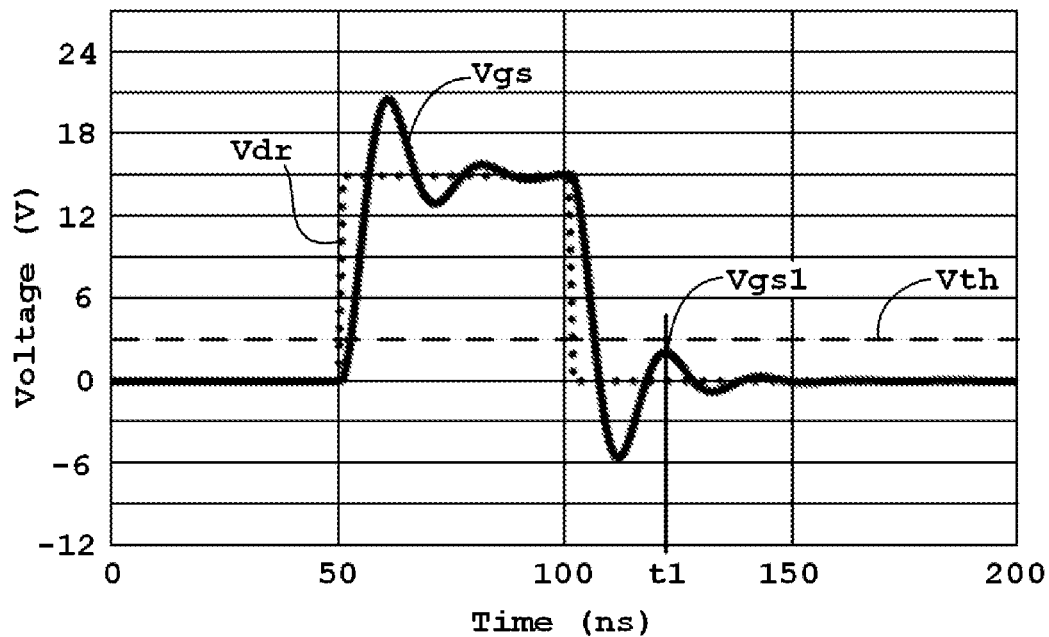
FIG. 4 is a graph showing time variation of a voltage when a gate pulse is input to a gate electrode by means of the switching module of Embodiment 1.

FIG. 4 is a graph showing time variation of a voltage when a gate pulse is input to a gate electrode by means of the switching module of Embodiment 1. As shown in FIG. 4, in which a horizontal axis presents time and a vertical axis presents the gate-source voltage, the output voltage Vdr generated by the gate pulse in the driver circuit 130 is indicated by a dotted line, and the gate-source voltage Vgs that is actually applied on the gate electrode G is as indicated by a solid line.

In this case, vibration occurring after off-pulse induces the generation of a gate-source voltage after one cycle, i.e., damping voltage (return voltage) Vgs1, at a time t1. As described above, it is suppressed that the MOSFET 120 causes an erroneous ignition by setting the resistance value of the gate resistance Rg such that the gate-source voltage Vgs1 at the time t1 does not exceed the predetermined threshold value Vth. In other words, the adjustment of the resistance value of the gate resistance Rg enables to adjust the damping constant ζ, and consequently a damping rate of the damping voltage (return voltage) Vgs1 can be controlled.

With the above configuration, since the driver circuit 130 and the MOSFET 120 are electrically connected to each other via the damping adjustment element 140 in addition to the bonding wires 150, 152, when the MOSFET 120 is replaced or a frequency used in the MOSFET is changed, the switching module 100 according to Embodiment 1 can adjust the damping voltage (return voltage) Vgs1 of the gate-source voltage by the gate resistance Rg of the damping adjustment element 140, and as a consequence the damping voltage is suppressed the occurrence the malfunction in the connection circuit of the MOSFET and the driver circuit.

Embodiment 2

In general, it is known that a MOSFET has its gate electrode G insulated from the other electrodes (drain electrode D and source electrode S) by an oxide film, capacitance of the oxide film being the cause of stray capacitance. The stray capacitance is in an inverse relationship with a frequency of the MOSFET that is used (i.e. as the frequency of the MOSFET increases, it is desirable that the stray capacitance is smaller), and thus a suitable MOSFET is selected according to an output frequency in the design of an amplifier.

In this regard, in equivalent connection circuit of a switching module equipped with the MOSFET, bonding wires for connecting a driver and the MOSFET have a stray inductance Ls and a resistance component Rs. The stray inductance Ls and the resistance component Rs form an RLC series circuit between them and a gate-source capacitance Cgs of the above-described stray capacitance, which circuit may produce series resonance that causes a problem of passing an excessive current through the circuit.

Figure 5:
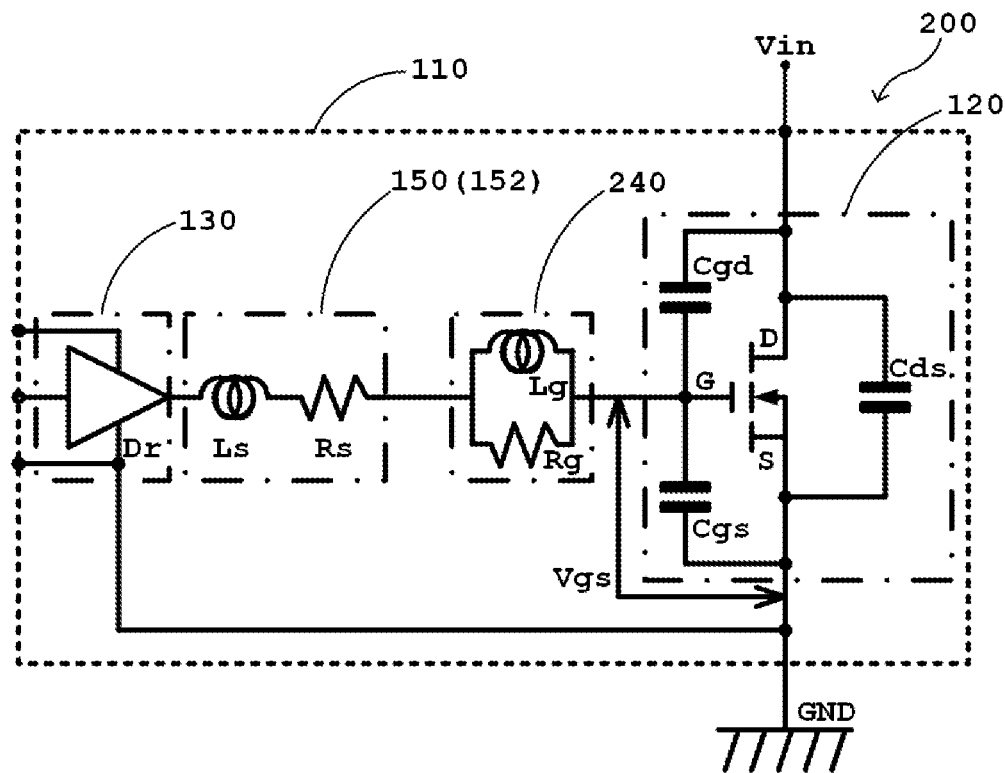
FIG. 5 is a circuit diagram showing equivalent connection circuit in the vicinity of a switching module of Embodiment 2 when the module is applied to an amplifier of a high-frequency power supply device.

FIG. 5 is a circuit diagram showing equivalent connection circuit in the vicinity of a switching module of Embodiment 2 when the switching module is applied to an amplifier of a high-frequency power supply device. Concerning a switching module 200 of Embodiment 2, constituent elements same as or similar to those of Embodiment 1 are allotted with the same reference numerals in Embodiment 1, and the description about them will be omitted.

As shown in FIG. 5, in the switching module 200 of Embodiment 2, a MOSFET 120 and a driver circuit 130 are mounted on a substrate 110, between which a damping adjustment element 140 and bonding wires 150, 152 are arranged and electrically connected to one another so as to form connection circuit from the driver circuit 130 to the MOSFET 120. In addition to that, FIG. 5 illustrates the case of connecting a voltage input Vin and a ground GN to the MOSFET 120, as with the case of Embodiment 1, and equivalent connection circuit of the high-frequency power supply device by different configurations are not shown and a description about it will be omitted.

In the switching module 200 shown in FIG. 5, a damping adjustment element 240 is configured as a vibration suppression circuit consisting of an RL parallel circuit formed by connecting in parallel a gate resistance Rg and a gate inductance Lg. In here, the gate resistance Rg shown in FIG. 5 employs the same configuration employed in Embodiment 1. The damping adjustment element 240 with such configuration has a function of controlling a damping voltage generated by the gate resistance Rg, and further has a function of applying a current having a low-frequency component (DC component) lower than a resonance frequency $\omega 0$ ($\omega 0 = Rg/Lg$) of the RL parallel circuit through the gate inductance Lg to the MOSFET 120 in a subsequent stage, while applying a high-frequency component higher than the resonance frequency $\omega 0$ of the RL parallel circuit through the gate resistance Rg to the MOSFET 120.

More specifically, in the damping adjustment element 240 shown in FIG. 5, for example, the number of turns of the gate inductance Lg is varied to change the inductance value. In this case, since the resonance frequency of the connection circuit formed from the driver circuit 130 to the MOSFET 120 is expressed by a function of the gate resistance Rg and the gate inductance Lg, when the inductance value of the gate inductance Lg changes, the resonance frequency of the connection circuit also changes. Consequently, the resonance frequency of the connection circuit can be adjusted freely, thereby suppressing the occurrence of series resonance in an RLC series circuit consisting of the connection circuit formed from the driver circuit 130 to the MOSFET 120.

Figure 6:
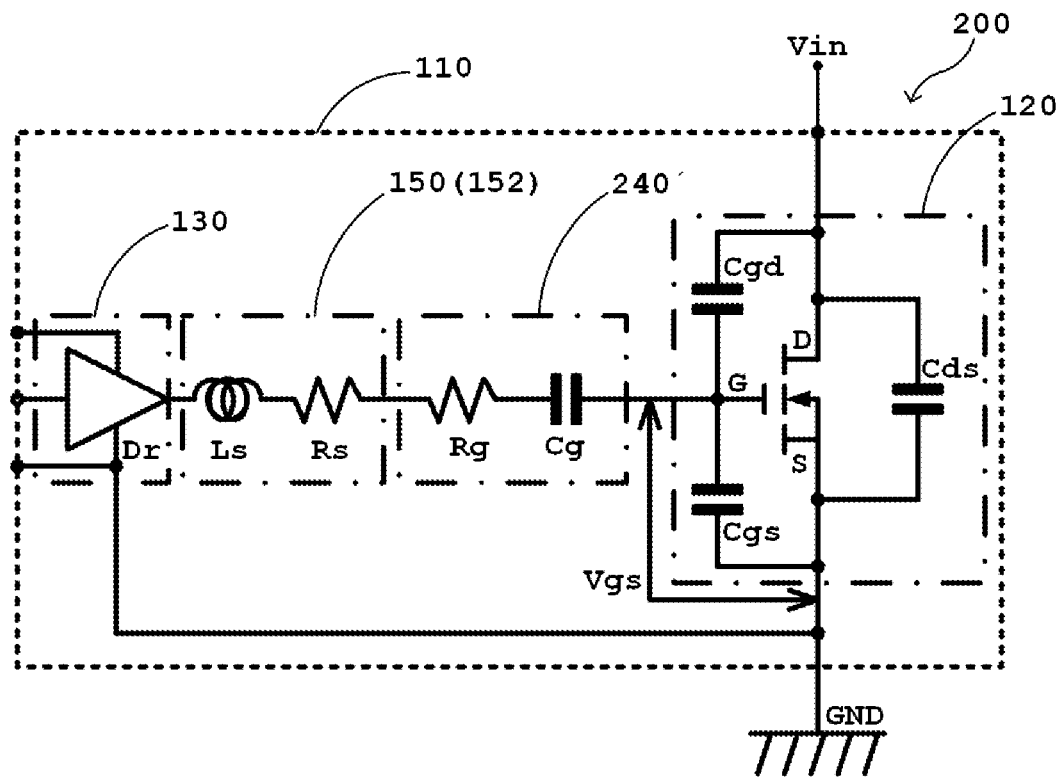
FIG. 6 is a circuit diagram showing equivalent connection circuit in the vicinity of a switching module in a variation of Embodiment 2 when the module is applied to an amplifier of a high-frequency power supply device.

FIG. 6 is a circuit diagram showing equivalent connection circuit in the vicinity of a switching module according to a variation of Embodiment 2 when the switching module is applied to an amplifier of a high-frequency power supply device. In this figure, as with the case of FIG. 5, constituent elements of a switching module 200 of Embodiment 2 same as or similar to those of Embodiment 1 are allotted with the same reference numerals in Embodiment 1, and the description about them will be omitted.

In the variation shown in FIG. 6, a damping adjustment element 240' is configured as a vibration suppression circuit consisting of an RC series circuit in which a gate resistance Rg and a gate capacitor Cg are connected in series. Such RC series circuit forms a vibrational absorption circuit together with stray inductances Ls included in bonding wires 150, 152. In here, the gate resistance Rg in FIG. 6 is configured in the same way as that of Embodiment 1. The damping adjustment element 240' with such configuration has a function of changing a voltage applied across each element in accordance with a resistant value of the gate resistance Rg and a capacitance of the gate capacitor Cg, in addition to a function of controlling a damping voltage by the gate resistance Rg.

More specifically, in the damping adjustment element 240' shown in FIG. 6, for example, by varying sizes and distances of electrode plates of the gate capacitor Cg, the capacitance value is changed. In this case, since a resonance frequency of connection circuit formed from a driver circuit 130 to a MOSFET 120 is expressed by a function of the stray inductance Ls and the gate capacitor Cg, when the capacitance value of the gate capacitor Cg changes, the resonance frequency of the connection circuit also changes. Consequently, as with the case of FIG. 5, the resonance frequency of the connection circuit can be adjusted freely, thereby suppressing the series resonance in an RLC series circuit consisting of the connection circuit formed from the driver circuit 130 to the MOSFET 120.

With the above-described configuration, since the damping adjustment elements 240, 240' can be configured as a vibration suppression circuit that includes the gate resistance Rg inside, by varying the value of the gate inductance Lg or gate capacitor Cg, which are disposed in parallel or in series to the gate resistance Rg, the switching module 200 of Embodiment 2 can provide the function of freely adjusting the resonance frequency in the connection circuit formed from the driver circuit 130 to the MOSFET 120, as well as giving the damping adjusting elements 240 and 240' the function as damping resistance due to the gate resistance Rg.

It is to be noted that the above-described embodiments and their variations are some examples of the switching module of the present invention, and thus the present invention is not limited thereto. Furthermore, those skilled in the art can modify the invention in various ways based on the gist of the invention, which modification are not be excluded from the scope of the present invention.

REFERENCE SIGNS LIST

100 Switching Module
110 Substrate
120 MOS FET
130 Driver Circuit
140 Damping Adjustment Element
142 Metallic Member
144 Base Member
146 Resistive Element
148 Protection Member
150, 152 Bonding Wire
200 Switching Module
240, 240' Damping Adjustment Element
G Gate Electrode
D Drain Electrode
S Source Electrode
Dr Driver
Rg Gate Resistance
Lg Gate Inductance
Cg Gate Capacitance
Vgs Gate-Source Voltage
Vgs1 Damping Voltage (Return Voltage)

The invention claimed is:

1. A switching module, in which a MOSFET and a driver circuit that applies a gate drive voltage to a gate electrode of the MOSFET are mounted on a substrate, wherein
the driver circuit is electrically connected to the MOSFET through a damping adjustment element and bonding wires arranged between the driver circuit and the gate electrode, the damping adjustment element includes at least a gate resistor configured to control a damping rate of a return voltage after application of a gate driving voltage from the driver circuit is completed, a dumping constant $\zeta$ for attenuating an amplitude of a gate-source voltage Vgs is defined by the following equation:

$$\zeta = Rg + Rg/2\sqrt{Ciss/Ls}$$

where Ciss is an input capacitance defined as Ciss=Cgs+Cgd, with Cgs being a gate-source capacitance and Cgd being a gate-drain capacitance of the MOSFET, Ls is a stray inductance, Rs is a resistance component of the bonding wire, and Rg is a gate resistance, Vgs1 is a gate-source voltage one cycle after the gate-source voltage Vgs from the driver circuit is turned off, wherein Vgs1 is characterized by an output voltage Vdr and is defined by the following equation:

$$Vgs1 = Vdr/\sqrt{1-\zeta^g} e - 2n\zeta/\sqrt{1-\zeta^g}$$

where the gate resistor is configured to have a resistance value Rg so that the gate-source voltage Vgs1 does not exceed a threshold value Vth that turns the MOSFET on.

2. The switching module according to claim 1, wherein the gate resistance is a high-power chip resistor or thin-film resistor.

3. The switching module according to claim 1, wherein the substrate is made of beryllium oxide or aluminum nitride.

* * * * *